United States Patent
Okuno

(10) Patent No.: US 6,217,343 B1
(45) Date of Patent: Apr. 17, 2001

(54) MULTIPOINT CONDUCTIVE SHEET

(75) Inventor: Toshio Okuno, Yokohama (JP)

(73) Assignee: Shoshotech Co., Ltd., Kanagawa-ken (JP)

(*) Notice: Subject to any disclaimer, the term of this patent is extended or adjusted under 35 U.S.C. 154(b) by 0 days.

(21) Appl. No.: 09/323,036

(22) Filed: Jun. 1, 1999

(30) Foreign Application Priority Data

Dec. 10, 1998 (JP) .................................................. 10-351704

(51) Int. Cl.⁷ .................................................. H01R 12/00
(52) U.S. Cl. .................................................. 439/67; 439/91
(58) Field of Search .................................. 439/66, 67, 91

(56) References Cited

U.S. PATENT DOCUMENTS

| | | | | |
|---|---|---|---|---|
| 5,207,585 | * | 5/1993 | Byrnes et al. | 439/66 |
| 5,239,448 | * | 8/1993 | Perkins et al. | 361/764 |
| 5,829,988 | * | 11/1998 | McMillan et al. | 439/70 |
| 5,915,977 | * | 6/1999 | Hembree et al. | 439/74 |
| 5,984,691 | * | 11/1999 | Brodsky et al. | 439/66 |

FOREIGN PATENT DOCUMENTS 7-231019    8/1995 (JP).

* cited by examiner

*Primary Examiner*—Cathy Lam
(74) *Attorney, Agent, or Firm*—Wenderoth, Lind & Ponack, L.L.P.

(57) ABSTRACT

A multipoint conductive sheet having a plurality of conductive electrons arranged, in a multipoint fashion, on an insulative sheet such that the conductive electrons extend from a first main surface of the insulative sheet all the way to a second main surface through a thickness of the insulative sheet, each of the conductive electrons being provided at one end thereof with a first contact end which is arranged, in a multipoint fashion, on the first main surface and at the other end with a second contact end which is arranged, in a multipoint fashion, on the second main surface, wherein a slit or a slot is formed adjacent to each of the conductive electrons in such a manner as to extend through the insulative sheet, the slit or slot is allowed to extend at least two ways of each of the conductive electrons, the conductive electrons are each arranged on a sheet piece at an inner region of each of the slits or slots, and the conductive electrons can be displaced towards the first and second main surfaces while flexing the sheet pieces.

7 Claims, 3 Drawing Sheets

MULTIPOINT CONDUCTIVE SHEET

BACKGROUND OF THE INVENTION

This invention relates to a multipoint conductive sheet used as a connecting medium interposed between given two electronic parts.

Japanese Patent Unexamined Publication No. Hei 7-231019 discloses a multipoint conductive sheet having, as means for connecting a semiconductor wafer and a wiring board together, a plurality of conductive electrons arranged, in a multipoint fashion, on an insulative sheet such that the conductive electrons extend from a first main surface of the insulative sheet all the way to a second main surface through a thickness of the insulative sheet, each of the conductive electrons being provided at one end thereof with a first contact end which is arranged, in a multipoint fashion, on the first main surface and at the other end with a second contact end which is arranged, in a multipoint fashion, on the second main surface. In this prior art, each of the multipoint conductive sheet is formed of a flexible substrate 101 having a large number of bumps 104 arranged thereon in a multipoint fashion.

The multipoint conductive sheet is interposed between a semiconductor wafer and a wiring circuit board and pressurized in that condition, so that the first contact ends are contacted, under pressure, with corresponding electrode pads of the semiconductor wafer. The wiring board is then connected to a tester so as to be subjected to burn-in test. An anisotropic conductive rubber is interposed between the wiring board and the multipoint conductive sheet so that uniform electrical connection can be obtained by absorbing irregularity in height of the conductive electrons, warping of the wiring board, etc.

The multipoint conductive sheet formed on the flexible substrate has a large number of conductive electrons densely arranged in such a manner as to correspond to the electrode pads of the semiconductor wafer, and each conductive electron can displace in the direction of the thickness by flexure of the flexible substrate. As shown in FIG. 1, however, since the respective conductive electrons 2 are displaced while normally restricted by the flexible substrate 1, adjacent conductive electrons 2 are apt to co-displace as indicated by arrows and broken lines with the result that the conductive electrons 2 are incorrectly displaced relative to the corresponding electrode pads.

SUMMARY OF THE INVENTION

It is, therefore, a general object of the present invention to provide a multipoint conductive sheet capable of solving the above-mentioned problems inherent in the prior art devices.

In order to achieve the above object, according to the present invention, there is essentially provided a multipoint conductive sheet having a plurality of conductive electrons arranged, in a multipoint fashion, on an insulative sheet such that the conductive electrons extend from a first main surface of the insulative sheet all the way to a second main surface through a thickness of the insulative sheet, each of the conductive electrons being provided at one end thereof with a first contact end which is arranged, in a multipoint fashion, on the first main surface and at the other end with a second contact end which is arranged, in a multipoint fashion, on the second main surface, wherein a slit or a slot is formed adjacent to each of the conductive electrons in such a manner as to extend through the insulative sheet, the slit or slot is allowed to extend at least two ways of each of the conductive electrons, the conductive electrons are each arranged on a sheet piece at an inner region of each of the slits or slots, and the conductive electrons can be displaced towards the first and second main surfaces while flexing the sheet pieces.

It is preferred that the slits or slots are continuously formed in such a manner as to surround three ways of each of the conductive electrons.

The slits or slots may be formed in two ways of each of the conductive electrons in opposingly parallel relation.

The conductive electrons are preferably formed by plating.

BRIEF DESCRIPTION OF THE DRAWING

Various advantages and features which characterize the present invention are pointed out with particularity in the claims annexed hereto and forms a part thereof. However, for a better understanding of the present invention, its advantages, and objects attained by its use, reference should be had to drawings, which from a further part thereof, and to the accompanying descriptive manner, in which there is illustrated and described a preferred embodiment of the present invention.

DETAILED DESCRIPTION OF THE EMBODIMENT

Figure 1:
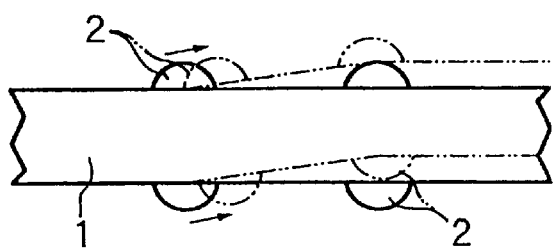
FIG. 1 is an enlarged view of the essential portion for explaining a co-displacement phenomenon of conductive electrons arranged on the conventional multipoint conductive sheet.

One embodiment of the present invention will now be described in detail with reference to FIGS. 2A to 6 of the accompanying drawing.

A multipoint conductive sheet 3 has a plurality of conductive electrons 4 arranged in multipoint fashion on a first main surface 3a of an insulative sheet 3c and extending all the way to a second main surface 3b through the thickness of the insulative sheet 3c.

The insulative sheet 3c is made of flexible synthetic resin film such as polyamide film.

Each conductive electron 4 is provided at one end thereof with a first contact end 4a which is arranged in multipoint fashion and at the other end with a second contact end 4b which is likewise arranged in multipoint fashion.

As best shown in FIG. 2, the respective first and second contact ends 4a, 4b form a spherical or chevron-like bump projecting from the first and second main surfaces 3a, 3b, respectively.

Figure 3:
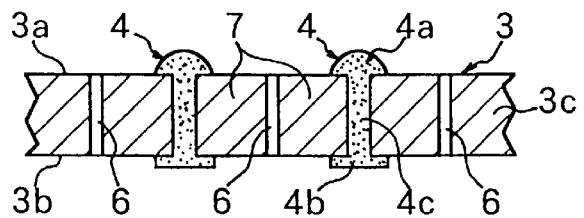
FIG. 3 is an enlarged sectional view of the essential portion, showing another example of bumps on the multipoint conductive sheet.

It is an interesting alternative that, as shown in FIG. 3, one of the first and second contact ends 4a, 4b is formed into a spherical or chevron-like bump projecting from the first main surface 3a and the other main surface, respectively, is formed into a land-like bump projecting from the second main surface 3b.

Each conductive electron 4 includes a connecting portion 4c which occupies the inside of a through hole 5 formed in the first main surface 3a of the insulative sheet 3c all the way to the second surface 3b. One end of the through hole, i.e., one end of the connecting portion 4b is continuous with the first contact end 4a formed of the bump and the other end is continuous with the second contact end 4b. The first and second contact ends 4a, 4b and the connecting portion 4c is a solid metal grain formed by growth of plating.

The bumps forming the first and second contact ends 4a, 4b have a larger sectional area than those of the through hole 5 and connecting portion 4c, and they intimately contact the surfaces of the first and second main surfaces 3a, 3b at the peripheral edges of the connecting portions 4c, i.e., at the peripheral edges of the opening end faces of the through holes 5. Each bump has a circular configuration in a plan view.

In the illustration, essential portions of the insulative sheet 3c and conductive electrons 3c are shown on an enlarged basis. Actually, those conductive electrons 4 are extremely small. They are densely arranged at small pitches over the entire area of the insulative sheet 3c. For example, the bumps of the first and second contact ends 4a, 4b are about 30 μm in diameter R1, the through holes 5 and connecting portions 4c are about 20 μm in diameter R2, and the bump pitches P are about 50 μm. A thickness T of the insulative sheet 3c is about 75 μm.

A method for manufacturing the multipoint conductive sheet 3 will now be described with reference to FIGS. 2A and 2B. This will be helpful for understanding of the structure of the multipoint conductive sheet 3.

Figure 2A:
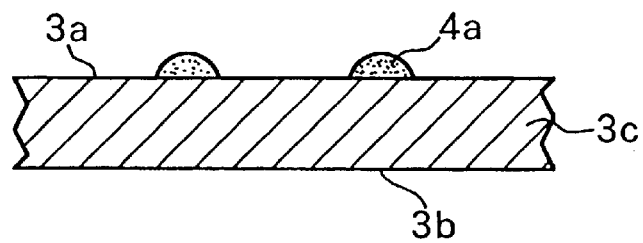
FIGS. 2A to 2D are enlarged side views of the essential portion for explaining the manufacturing process, in sequential order, according to one embodiment of the present invention.

As shown in FIG. 2A, a large number of bumps (first contact ends 4a) are formed on the first main surface 3a made of polyimide or the like, by plating, printing, or the like in such a manner as to intimately adhered to the first main surface 3a.

Figure 2B:
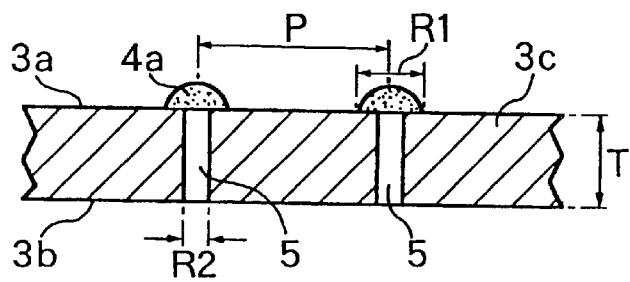

Then, as shown in FIG. 2B, the through holes 5 are formed in the insulative sheet 3c by laser beam such that the through holes 5 extend from the second main surface 3b to the first main surface 3a. The through holes 5 are coaxial with the bumps of the first and second contact ends 4a, 4b.

Figure 2C:
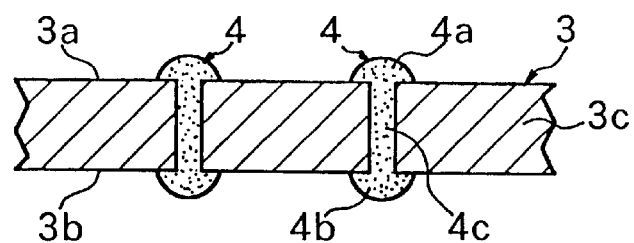

Then, as shown in FIG. 2C, conductive metal is filled in the through holes 5 by plating such that the conductive metal joins central portions of the intimately adhered surfaces of the bumps of the first contact ends 4a at one opening end faces of the through holes 5 and the bumps of the second contact ends 4b projecting from the other open end faces of the through holes 5 are enhanced to grow (growth of plating). Thus, the second contact ends 4b are integrally joined with the end portions of the connecting portions 4c.

Figure 2D:
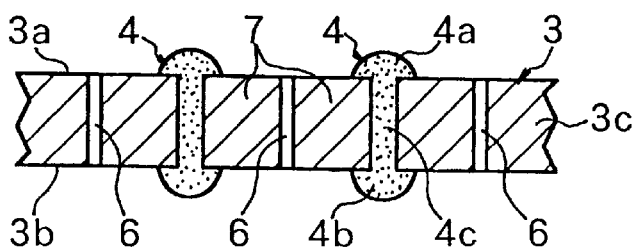

Then, as shown in FIG. 2D, slits or slots 6 are formed in the insulative sheet 3c in such a manner as to be adjacent with each conductive electron 4.

Figure 4A:
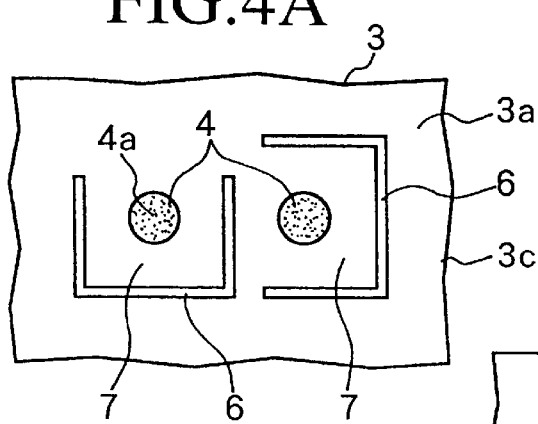
FIG. 4A is an enlarged plan view of the essential portion of the multipoint conductive sheet, showing a first example of a slit or slot.
Figure 4B:
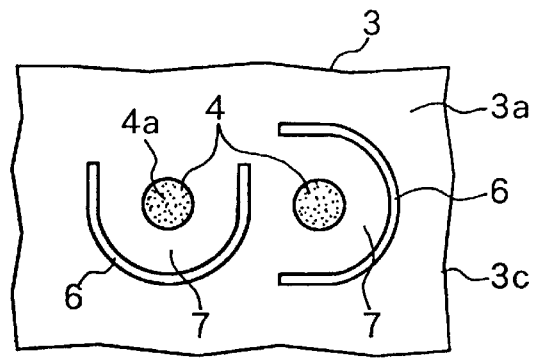
FIG. 4B is an enlarged plan view of the essential portion, showing a second example of the slit or slot.
Figure 4C:
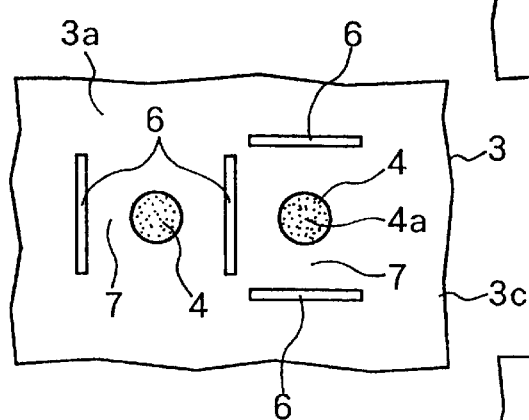
FIG. 4C is an enlarged plan view of the essential portion, showing a third example of the slit or slot.
Figure 4D:
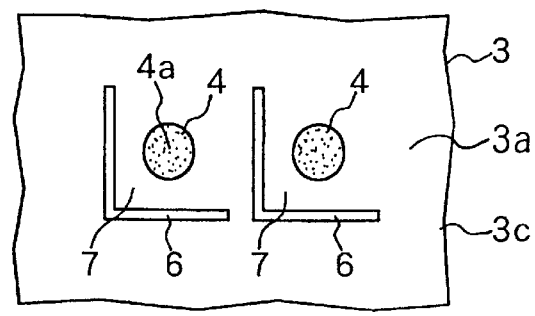
FIG. 4D is an enlarged plan view of the essential portion, showing a fourth example of the slit or slot.
Figure 5A:
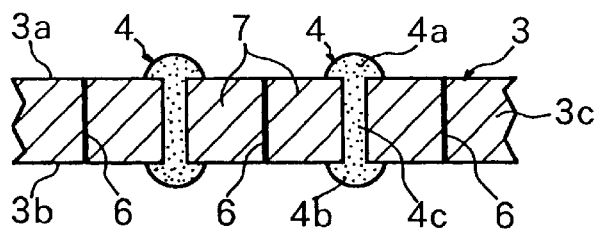
FIG. 5A is an enlarged plan view of the essential portion of the multipoint conductive sheet formed with the slit.
Figure 5B:
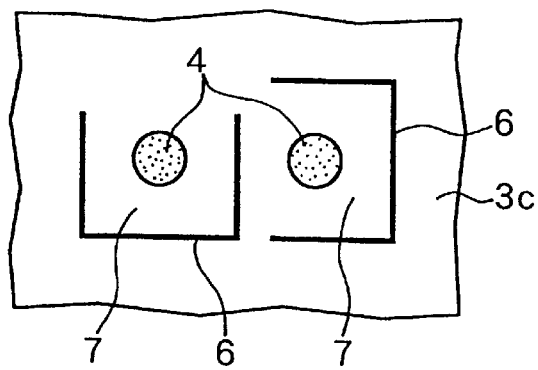
FIG. 5B is a sectional view thereof.

The slits herein used refer to those formed, as shown in FIGS. 5A and 5B, by linearly splitting the insulative sheet 3c without cutting out the mother material of the insulative sheet 3, while the slots refer to those which are formed, as shown in FIGS. 2 through 4, by partly cutting out the mother material. Thus, the slots have a certain size of an opening area each. The slits may be formed by a cutting tool and the slots may be formed by punching out using a cutting tool or burned off using laser beam in such a manner as that each slot has a constant width.

Preferably, the slots 6 are formed by burning off the insulative sheet 3c using laser beam. The slots 6 thus formed are increased in strength at the peripheral edge portions. Thus, the insulative sheet 3c are not easily torn off at the slot portions. In addition, the width of each slot 6 can easily be set. Accordingly, very small slots can easily be formed between the adjacent bumps which are arranged at very small pitches.

The slits or slots are formed in such a manner that they extend at least two ways, forwardly/backwardly and leftwardly/backwardly of each conductive electron 4. The slits or slots define sheet pieces 7 at inner regions thereof which sheet pieces 7 are separated from the insulative sheet 3c. The conductive electrons 4 are arranged on those sheet pieces 7.

The respective conductive electrons 4 can be displaced towards the directions of the main surfaces 3a, 3b by flexing the sheet pieces 7.

As shown in FIGS. 4A and 4B, the slits or slots 6 are continuously formed in such a manner as to surround the three ways of the respective conductive electrons 4. In FIG. 4A, each slit or slot 6 is formed in a U-shaped configuration consisting of three sides of a square shape. In FIG. 4B, each slit or slot 6 is formed in an arcuate U-shaped configuration. The conductive electrons 4 are arranged in the inner region defined by the slits or slots 6.

As another example, the slits or slots 6 are formed, as shown in FIG. 4C, in two ways of the conductive sheet 4 in a parallelly opposing manner.

As still another example, the slits or slots 6 are formed, as shown in FIG. 4D, in an L-shaped configuration. For example, the slits or slots 6 are formed of two sides of a square shape. In any of the examples of FIGS. 4C and 4D, the conductive electrons 4 are arranged on the sheet piece 7 at an inner region defined by the slits or slots 6.

In case the U-shaped slits or slots 6 are formed as shown in FIGS. 4A and 4B, two opposing slits or slots 6 are formed vertically with one of the adjacent electrons 4 disposed therebetween and another two opposing slits or slots 6 are formed laterally with the other of the adjacent electrons 4 disposed therebetween, so that the adjacent U-shaped slits or slots 6 are not interfered with each other and so that the U-shaped slits or slots 6 are properly formed between the conductive electrons 4 which are arranged at very small pitches.

Figure 6:
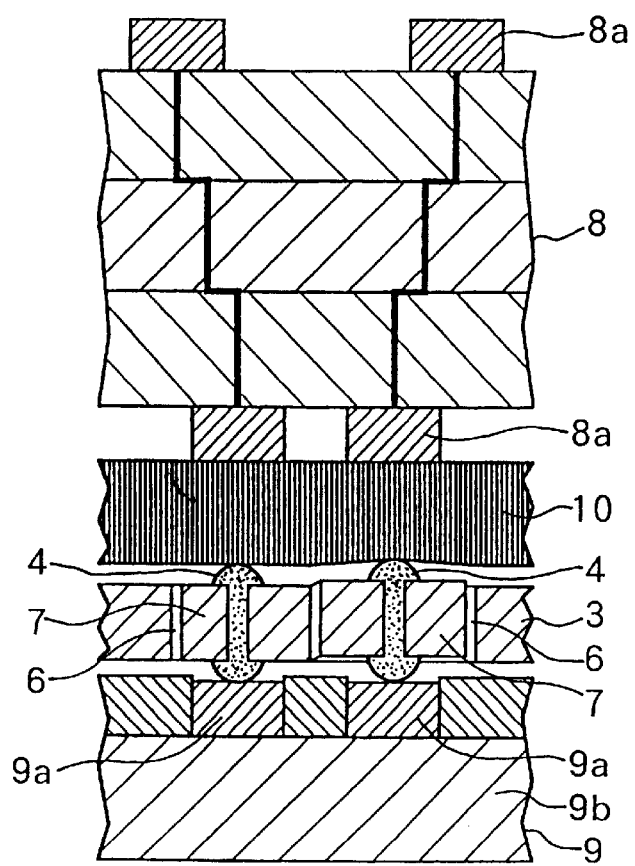
FIG. 6 is an enlarged sectional view of the essential portion of a test device in which electronic parts are connected together with the multipoint conductive sheet.

As shown in FIG. 6, the multipoint conductive sheet 3 is interposed as a connecting medium between given two electronic parts such as, for example, between a wiring board 8 and a liquid crystal panel 9, a plasma display unit, a semiconductor package, a semiconductor chip or a semiconductor wafer. The wiring board 8 is composed of a multilayered substrate and has a large number of electrode pads 8a as external contacts.

On the other hand, the liquid crystal panel 9 is a substrate fabricated of a glass substrate 9b having electrode pads 9a, as external pads, arranged in array on a surface thereof. Similarly, the plasma display, the semiconductor package, the semiconductor chip or the semiconductor wafer has a large number of electrode pads 9a, as external contacts, arranged on its surface confronting the multipoint conductive sheet 3.

An anisotropic conductive elastomer 10 having elastic properties may be interposed between the multipoint conductive sheet 3 and the wiring board 8 so that irregularity in height of the conductive electrons 4 can be absorbed. The conductive electrons 4 are arranged in such a manner as to correspond to the electrode pads 8a, 9a and therefore, the first and second contact ends 4a, 4b are arranged in such a manner as to correspond to the electrode pads 8a, 9a, so that the respective elements 4, 4a, 4b, 8a, 9a are contacted under pressure on a co-axis.

Thus, by placing the wiring board 8, the anisotropic conductive elastomer 10, the liquid crystal panel 9, etc. one upon another in this order and pressurizing them in the placing direction, the first contact ends 4a of the conductive electrons 4 are contacted, under pressure, with the electrode pads 8a of the wiring board 8 and the second contact ends 4b are contacted, under pressure, with the electrode pads 9a of the liquid crystal panel 9, etc.

The wiring board 8 is connected with a tester. Therefore, through the multipoint conductive sheet 3, effective electrical connection between the liquid crystal panel 9, etc. as an object to be tested and the testing wiring board 8 can be obtained even in the condition of a very small pitch arrangement.

According to the present invention, the respective conductive electrons are arranged on sheet pieces partly cut-away from an insulative sheet by the slits or slots and therefore, the sheet pieces are free from restriction by the insulative sheet at those areas where the slits or slots are formed. Consequently, a certain degree of freedom for independently vertically displacing the sheet pieces together with the conductive electrons can be given to the sheet pieces.

As a consequence, the co-displacing phenomenon of the adjacent conductive electrons, which otherwise would occur when the respective conductive electrons are vertically displaced accompanying flexure of the insulative sheet, can effectively be prevented. Thus, correct relative position between the first and second contact ends of the respective conductive electrons and the electrode pads can be obtained.

Moreover, incorrect displacement of the conductive electrons can effectively prevented by simple means for forming slits or slots for each conductive electron. Thus, the invented multipoint conductive sheet is extremely effective as a contact medium capable of fulfilling the requirement of a very small pitch arrangement of electrode pads.

While there has been described what is at present considered to be the preferred embodiment of the invention, it will be understood that various modifications may be made thereto, and it is intended that the appended claims cover all such modifications as fall within the true spirit and scope of the invention.

What is claimed is:

1. A multipoint conductive sheet comprising:

an insulative sheet having a first main surface, a second main surface and a thickness;

a plurality of conductive electrodes arranged in a multipoint fashion and extending from said first main surface of said insulative sheet all the way to said second main surface of said insulative sheet through the thickness of said insulative sheet;

wherein each of said conductive electrodes includes a first contact end arranged on said first main surface of said insulative sheet, a second contact end arranged on said second main surface of said insulative sheet, and a connecting portion extending through said insulative sheet and connecting between said first and second contact ends;

wherein at least one slit or slot is formed through said insulative sheet adjacent each of said conductive electrodes so as to extend on at least two sides of each of said conductive electrodes and thereby form a sheet piece at an inner region of said at least one slit or slot around each of said conductive electrodes, whereby said conductive electrodes can be displaced in the thickness direction of said insulative sheet by flexing of said sheet pieces; and wherein, for each of said conductive electrodes, said first and second contact ends are coaxial with said connecting portion.

2. A multipoint conductive sheet according to claim 1 wherein each of said slits or slots is continuously formed in such a manner as to surround each of said conductive electrodes on three sides.

3. A multipoint conductive sheet according to claim 1, wherein said slits or slots are formed on two sides of each of said conductive electrodes in opposing parallel relation.

4. A multipoint conductive sheet according to claim 1, wherein said conductive electrodes are formed by plating.

5. A multipoint conductive sheet according to claim 1, wherein said insulative sheet has through holes therein through which said conductive electrodes extend, respectively; and said connecting portions of said conductive electrodes fill said through holes, respectively.

6. A multipoint conductive sheet according to claim 1, wherein for each of said conductive electrodes, said first and second contact ends and said connecting portion are constituted by a solid metal grain formed by plating growth.

7. A multipoint conductive sheet according to claims 1, wherein for each of said conductive electrodes, said first and second contact ends are integrally formed in one piece with said connecting portion.

* * * * *